United States Patent
Parrish et al.

(10) Patent No.: US 10,075,658 B2
(45) Date of Patent: Sep. 11, 2018

(54) DATA DIGITIZATION AND DISPLAY FOR AN IMAGING SYSTEM

(71) Applicant: Seek Thermal, Inc., Goleta, CA (US)

(72) Inventors: William J. Parrish, Santa Barbara, CA (US); Andreas Engberg, Santa Barbara, CA (US)

(73) Assignee: Seek Thermal, Inc., Santa Barbara, CA (US)

( * ) Notice: Subject to any disclaimer, the term of this patent is extended or adjusted under 35 U.S.C. 154(b) by 955 days.

(21) Appl. No.: 14/292,124

(22) Filed: May 30, 2014

(65) Prior Publication Data
US 2015/0350567 A1    Dec. 3, 2015

(51) Int. Cl.
| | | |
|---|---|---|
| *H04N 5/33* | (2006.01) | |
| *H03M 1/18* | (2006.01) | |
| *H03M 1/12* | (2006.01) | |
| *H03M 1/56* | (2006.01) | |

(52) U.S. Cl.
CPC .............. *H04N 5/33* (2013.01); *H03M 1/182* (2013.01); *H03M 1/123* (2013.01); *H03M 1/56* (2013.01)

(58) Field of Classification Search
CPC ........... H04N 5/33; H04N 5/378; H03M 1/56; H03M 1/123; H03M 1/182; H03M 5/33; H03M 1/00; H03M 1/12; H03M 1/14; H03M 7/00
USPC ................... 250/338.1, 332, 252.1; 348/164; 341/155, 169
See application file for complete search history.

(56) References Cited

U.S. PATENT DOCUMENTS

| | | | |
|---|---|---|---|
| 5,200,623 A | 4/1993 | Cannata | |
| 6,816,102 B2* | 11/2004 | Pavicic | H03M 1/127 341/122 |
| 8,466,995 B2* | 6/2013 | Suzuki | H04N 5/3575 348/308 |
| 8,982,262 B2* | 3/2015 | Bugnet | H04N 5/3743 250/208.1 |
| 9,232,165 B2* | 1/2016 | Saito | H04N 5/3575 |
| 9,571,777 B2* | 2/2017 | Kusano | H03M 1/56 |
| 2006/0139198 A1* | 6/2006 | Rao | H03M 1/1028 341/155 |

(Continued)

OTHER PUBLICATIONS

Provost, Benoit et al., "On-Chip Ramp Generators for Mixed-Signal BIST and ADC Self-Test", 2003, IEEE Journal of Solid-State Circuits, 38 (2), pp. 263-273.*

*Primary Examiner* — David Porta
*Assistant Examiner* — Blake Riddick
(74) *Attorney, Agent, or Firm* — Knobbe Martens Olson & Bear LLP

(57) ABSTRACT

A system and method for digitizing data from an imaging system includes sampling a signal from an optical detector with a first circuit having a first attenuation and with a second circuit having a second attenuation different than the first attenuation. The system and method further includes digitizing the sampled signal at a predetermined number of bits desired for an analog to digital conversion of the sampled signal by allocating a first portion of bits to digitizing a signal from the first circuit and allocating a second portion of bits to digitizing a signal from the second circuit. The system and method further includes encoding the first and second portion of bits into one monotonic digital word corresponding to a range of the sampled signal.

22 Claims, 7 Drawing Sheets

(56) References Cited

U.S. PATENT DOCUMENTS

| | | | | |
|---|---|---|---|---|
| 2009/0256735 | A1* | 10/2009 | Bogaerts | H04N 5/3575 341/169 |
| 2010/0039306 | A1* | 2/2010 | Simony | H03M 1/182 341/156 |
| 2013/0077888 | A1* | 3/2013 | Meyers | G06T 5/50 382/274 |
| 2013/0242125 | A1* | 9/2013 | Yang | H04N 5/378 348/222.1 |
| 2013/0258131 | A1* | 10/2013 | Hashimoto | H04N 5/225 348/222.1 |
| 2013/0268212 | A1* | 10/2013 | Makarov | H01J 49/025 702/32 |
| 2014/0078360 | A1* | 3/2014 | Park | H04N 5/355 348/294 |
| 2014/0108850 | A1* | 4/2014 | Simolon | G06F 1/14 713/502 |
| 2014/0313385 | A1* | 10/2014 | Sato | H04N 5/378 348/302 |

* cited by examiner

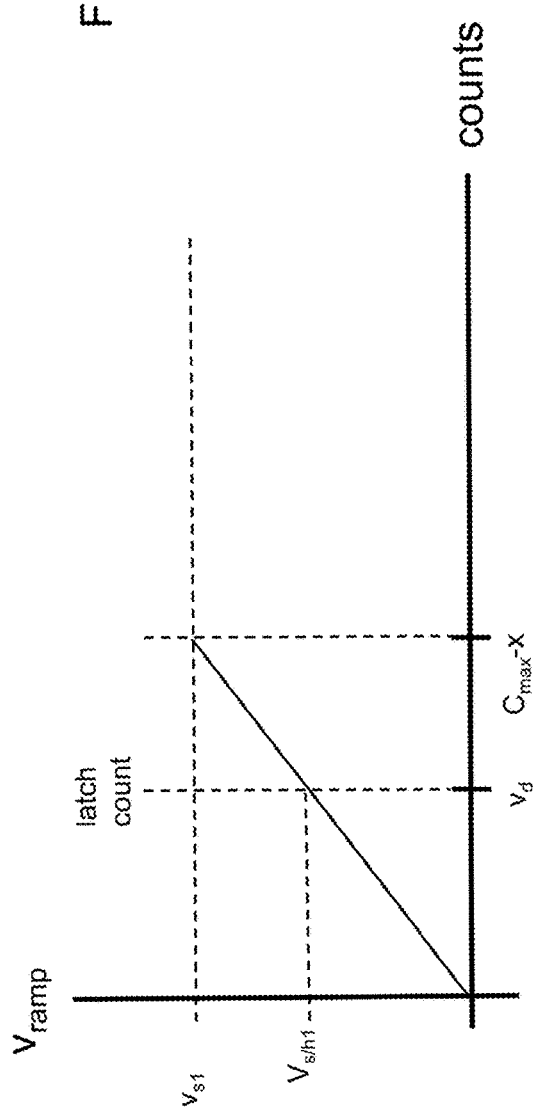
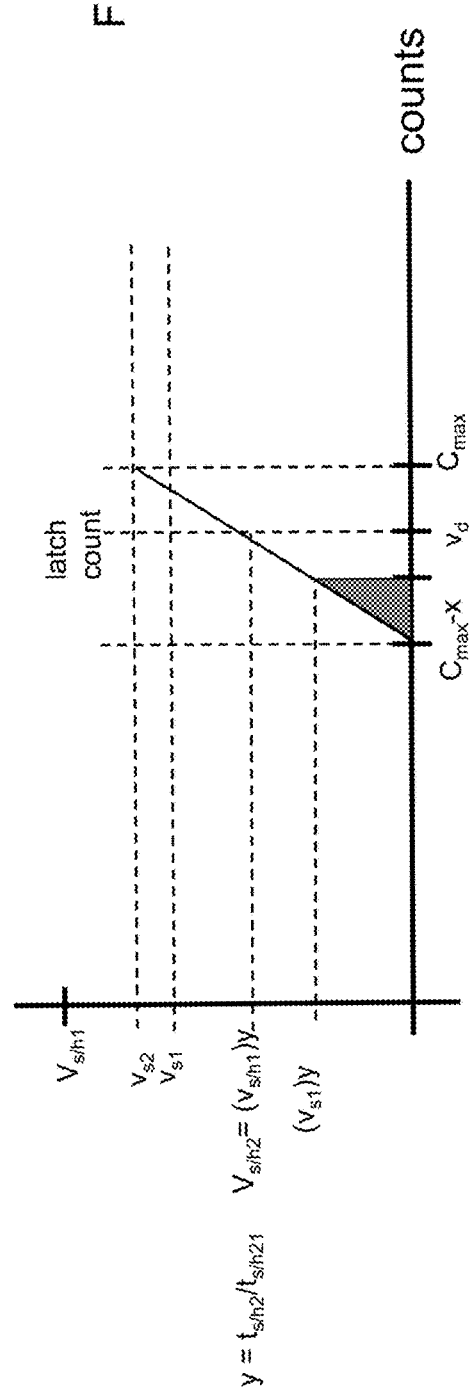

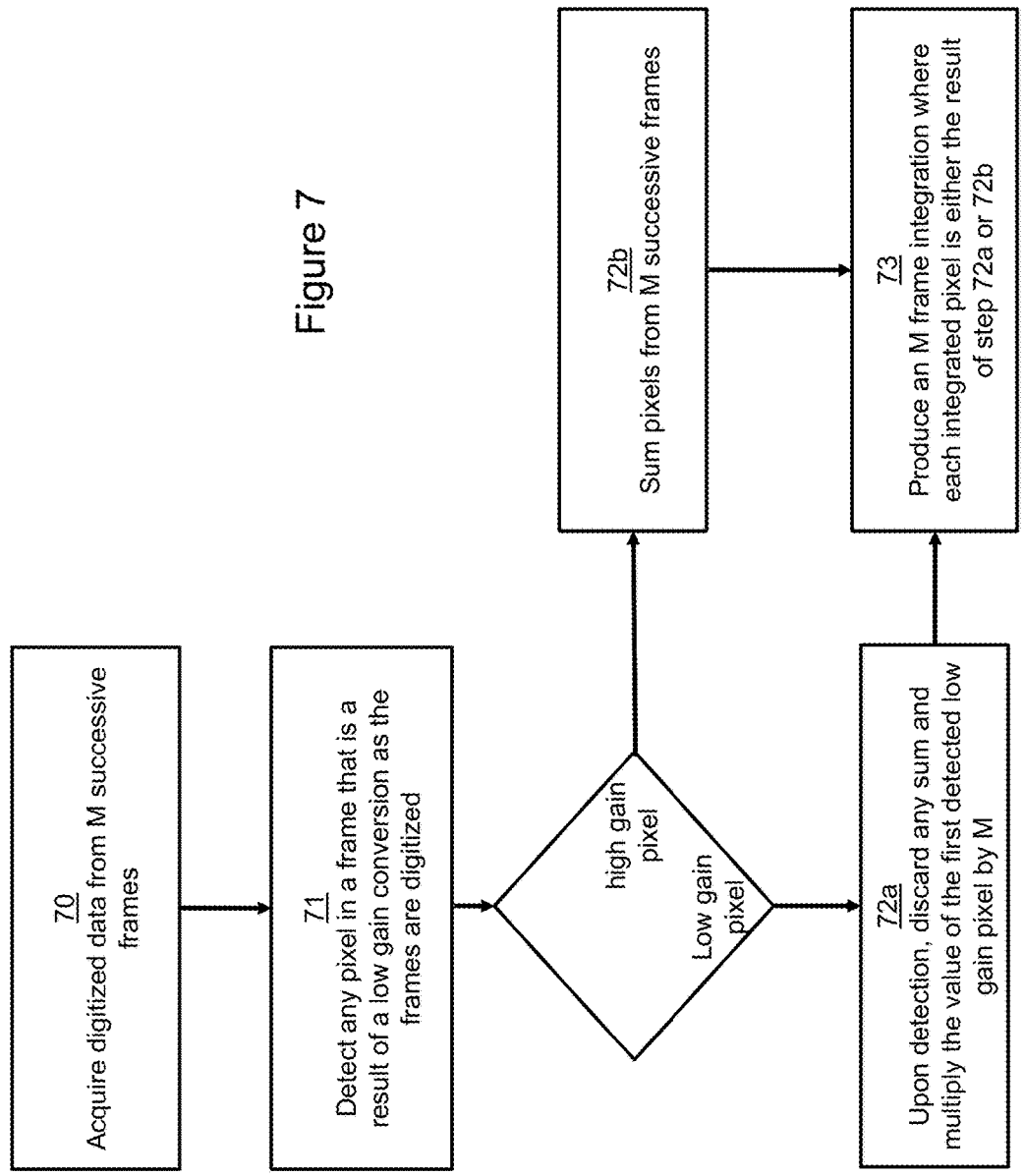

DATA DIGITIZATION AND DISPLAY FOR AN IMAGING SYSTEM

RELATED APPLICATIONS

Not Applicable

FEDERALLY SPONSORED RESEARCH

Not Applicable

SEQUENCE LISTING

Not Applicable

BACKGROUND

This specification relates to imaging systems such as cameras including infrared cameras and in particular to a system and method for analog to digital conversion with extended dynamic range and enhanced image display of image data from infrared (IR) focal plane arrays, and in particular for thermal imaging.

Infrared imaging sensors have long been expensive and difficult to produce, thus limiting the employment of high performance, long wave imaging (thermal imaging) to high value instruments, such as aerospace, military, or large scale commercial applications. For many of these applications, the systems are designed for temperature resolution and radiometric accuracy. High performance, low cost uncooled infrared (IR) imaging devices, such as bolometer focal plane arrays (FPA's), can be used for mass produced, consumer oriented IR cameras. Low cost, high volume IR imaging devices have different design challenges and constraints than high value systems, and the visual image may be a goal of the system design.

An IR focal plane array (FPA) for an IR camera is typically a two-dimensional array of photodetectors interfaced and integrated with a Readout Integrated Circuit (ROIC or "readout") to form a sensor chip, the heart of an IR camera. To reduce cost and simplify the camera design, as much of the signal processing electronics as possible is integrated into the readout component of the FPA. Readout design options are limited by power consumption, space and microfabrication design rules.

BRIEF SUMMARY

According to some embodiments, an improved slope/latch count analog to digital converter (A/D) may be provided that has a reduced component count and is simpler in operation and subsequent data processing. The improved A/D may be suitable for inclusion in a readout IC for an IR FPA.

The improved readout A/D may include a ramp generator and a digital counter. The counter may count from zero to a value equivalent to the desired A/D conversion size, $C_{max}$. For instance if a 14 bit conversion is required, the counter may count from 0 to $C_{max}=16383$. The readout may connect a photodetector signal to a buffer circuit whose output, $v_a$, is sampled by at least two sample and hold elements, sampling the signal for longer and shorter sample or integration times, providing a long integration signal path and a short integration signal path. The long integration path signal is sent to a comparator and compared to the ramp voltage, whose slope is set to ramp from zero to a predetermined voltage $v_{s1}$ in approximately the time it takes the counter to count from zero to $C_{max}-x$, where x is preferably much less than $C_{max}$. The counter and the ramp may be started substantially together. The counter may be connected to a latch and the comparator output may be used to trigger the latch.

In an illustrative embodiment, if the ramp signal equals the long integration output before the counter reaches $C_{max}-x$, the count is latched and the latched count is the digital conversion. If the latching does not happen, the shorter integration time signal is connected to the comparator, the ramp is set to zero and the slope is adjusted to ramp from zero to a predetermined voltage $v_{s2}$ in approximately the time it takes the counter to count from $C_{max}-x$ to $C_{max}$. The count is latched when the ramp signal equals the short sample/hold output, and the latched count is the digital conversion.

According to another embodiment, a method for digitizing data from an imaging system comprises sampling a signal from an optical detector with a first circuit having a first attenuation and with a second circuit having a second attenuation different than the first attenuation. The method further comprises digitizing the sampled signal by allocating a predetermined number of bits desired for an analog to digital conversion of the sampled signal with a first portion of bits allocated to digitizing a signal from the first circuit and a second portion of bits allocated to digitizing a signal from the second signal. One monotonic digital word is generated that corresponds to a range of the sampled signal.

In another embodiment, the digital conversion may be a plurality of words corresponding to intensity values for the pixels in a two dimensional optical detector array, such as an IR FPA, captured during an image frame. The number of intensity words at a given intensity may be plotted versus intensity value to form a histogram. The intensity words may be assigned image display levels using Histogram Equalization Based Methods (HEBM).

In another embodiment, combining data from successive frames, some of which may be converted using the long integration signal path and some from the short integration signal path is done conditionally.

BRIEF DESCRIPTION OF THE DRAWINGS

The invention will be better understood by referring to the following figures.

FIGS. 2a and 2b illustrate the operation of an A/D integrator, according to an illustrative embodiment.

FIG. 7 illustrates a flowchart of a method of conditionally combining data from successive frames, according to an illustrative embodiment.

DETAILED DESCRIPTION

One or more embodiments may provide for mass-produced infrared cameras which are low cost and have a simple implementation.

One or more embodiments may produce a thermal image that shows temperature differences in a scene in a visually clear manner.

One or more embodiments may reduce the component count while increasing the functionality of the readout.

One or more embodiments may provide an efficient design for signal processing electronics in combination with image display techniques that produces a visually satisfying IR image while simplifying camera system design.

One or more embodiments may apply slope/latch count analog to digital conversion to FPA design.

One or more embodiments may avoid design and implementation complexity associated with designs concerned with preserving resolution and linearity across an entire range.

One or more embodiments may avoid performing operations and producing data in a form not needed or desirable for low cost IR cameras.

One or more embodiments may utilize a novel approach to slope/latch count analog to digital conversion that achieves dynamic range enhancement (but not with uniform conversion resolution), utilizes a simpler electrical design and/or produces data better suited for the visual image enhancement desirable for a mass-produced IR/thermal imaging camera.

One or more embodiments may provide dynamic range extension that produces monotonic data in the form of a single digital word per conversion.

One or more embodiments may provide on-chip conversion of image data from bolometer based infrared focal plane arrays used in IR cameras.

One or more embodiments may apportion resolution to image display applications, allocating higher A/D resolution to smaller, lower noise signals.

One or more embodiments may be used in conjunction with a Histogram Based Equalization Method to produce superior thermal image quality with a minimal component count and efficient image data handling.

One or more embodiments may be used to combine data from successive frames which may originate from both the long and short integration signal paths conditionally.

Figure 1:
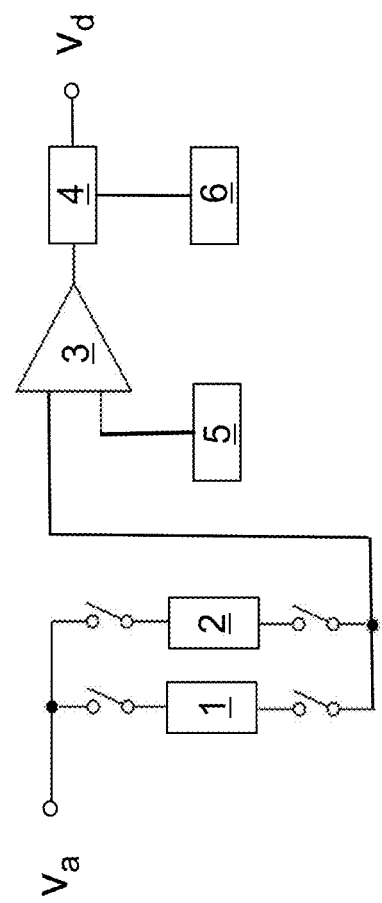
FIG. 1 shows an A/D integrator in block diagram form, according to an illustrative embodiment.

Referring to FIG. 1, a digitization system in the form of a novel variation of a slope/latch count A/D converter is shown in block diagram form, according to an illustrative embodiment. A detector signal, corresponding to intensity, $v_a$, suitably buffered and integrated (not shown) is connected to a first sample and hold element or circuit 1, for a long integration time $t_{s/h1}$ and to a second sample and hold element or circuit 2 for a shorter integration time $t_{s/h2}$. This arrangement effectively applies a first attenuation (lower gain) on the short sample time signal path. The signal from second sample/hold circuit 2, $v_{s/h2}$, will be $t_{s/h2}/t_{s/h1}$ times the first integrator signal $v_{s/h1}$. Thus a low and a high gain signal path are established.

Outputs of first and second sample and hold circuits 1 and 2 are sequentially switched to a comparator 3 using the switches shown, where they are compared to a voltage ramp from a programmable ramp generator circuit 5. The output of the comparator 3 is used to trigger a latch or other storage element 4, which latches a count from a digital counter 6. The counter 6 may count from 0 to $C_{max}$, where $C_{max}$ is the A/D conversion resolution. For example, if the counter counts from 0 to $C_{max}=16383$, the A/D conversion is a 14 bit conversion. The latched count is the digitized signal $v_d$.

The processing circuit components of FIG. 1 may be implemented using any of a variety of analog and/or digital discrete circuit components (transistors, resistors, capacitors, inductors, diodes, etc.), programmable logic, microprocessors, microcontrollers, application-specific integrated circuits, or other circuit elements. A memory configured to store a computer program may be implemented along with discrete circuit components to carry out one or more of the processes described herein. The processes of one or more of the circuit elements shown in FIG. 1 may be combined with one another or separated out into separate circuits in various alternative embodiments. Each block in FIG. 1 may represent one or a plurality of circuits. For example, ramp generator 5 may comprise one ramp generator used for comparison or a plurality of ramp generators, one each for comparison to the first sampled signal and the second sampled signal (and optionally, additionally sampled signals). A third S/H circuit may be used with an integration time longer or shorter than both of S/H circuits 1 and 2, as well as a fourth, etc., for additional range and/or resolution. Processing circuitry may be added to FIG. 1 to control timing of the switches, latching, inputs and outputs of each of the elements of FIG. 1.

Referring to FIGS. 2a and b, operation of an A/D converter is shown, according to an illustrative embodiment. $V_{s/h1}$ is sent to, connected to, or received by the comparator after a time equal to or greater than $t_{s/h1}$. The counter and the ramp signal are started together, substantially simultaneously. Alternatively, the signals may be started with a fixed delay corresponding to a known voltage offset. The ramp generator ramps from zero or another initial voltage to a predetermined voltage $v_{s1}$ in approximately the time it takes the counter to count from zero to $C_{max}-x$, where x is preferably many times smaller than $C_{max}$. $V_{s1}$ can be any of a variety of values depending on the system constraints and performance as will be discussed below.

FIG. 2a illustrates the case where $v_{s/h1}$ is less than or equal to the first sampled signal $v_{s1}$. The comparator will trigger before $C_{max}-x$ is reached and the count will be latched as the digitized output $v_d$. In this case, the first sampled signal is within the voltage $v_{s1}$ and the corresponding range of counts $C_{max}-x$ defined by the counter and the ramp. FIG. 2b illustrates the case where $v_{s/h1}$ is greater than $v_{s1}$ so the comparator will not trigger before the count reaches $C_{max}-x$. In this case, the ramp generator is reprogrammed to ramp from zero to predetermined voltage $v_{s2}$ in the time the counter counts from $C_{max}-x$ to $C_{max}$. At approximately the same time as the ramp restarts, the output of the second S/H $v_{s/h2}$ is switched to the comparator in place of $v_{s/h1}$. $v_{s/h2}$ is equal to $v_{s/h1}$ times y where $y=t_{s/h2}/t_{s/h1}$. Thus $v_{s/h2}$ is lower in amplitude than $v_{s/h1}$, i.e. more attenuated, for the same input signal, and therefore the dynamic range of input signals $v_a$ that can be converted is extended. The comparator triggers when the ramp reaches $v_{s/h2}$ and the count is latched as the digitized signal $v_d$. Thus the two signal paths, of differing attenuation (gains) are each converted using two portions of the full count $C_{max}$ and, as a result, the conversion is encoded as one monotonic digital word of length $C_{max}$.

In this embodiment, x is chosen to be much smaller than $C_{max}$, which results in the higher amplitude detector signals being converted at a lower resolution than the lower amplitude signals. This is suitable for a microbolometer based FPA where the higher signal amplitude (hotter) signals do not benefit greatly from high resolution conversion. Also in this embodiment, the first part of the second conversion cycle (FIG. 2b) is basically excluded. Since $v_{s/h1}$ is greater than $v_{s1}$ for this case, $v_{s/h2}$ must be greater than $v_{s1}$ times y for any possible latch condition, so no latching takes place until the second steeper slope ramp voltage exceeds $(v_{s1})y$.

This exclusion region is shown in grey in FIG. 2b. In other words, in this embodiment the counts in this exclusion zone will not be a resultant conversion $v_d$.

Figure 3A:
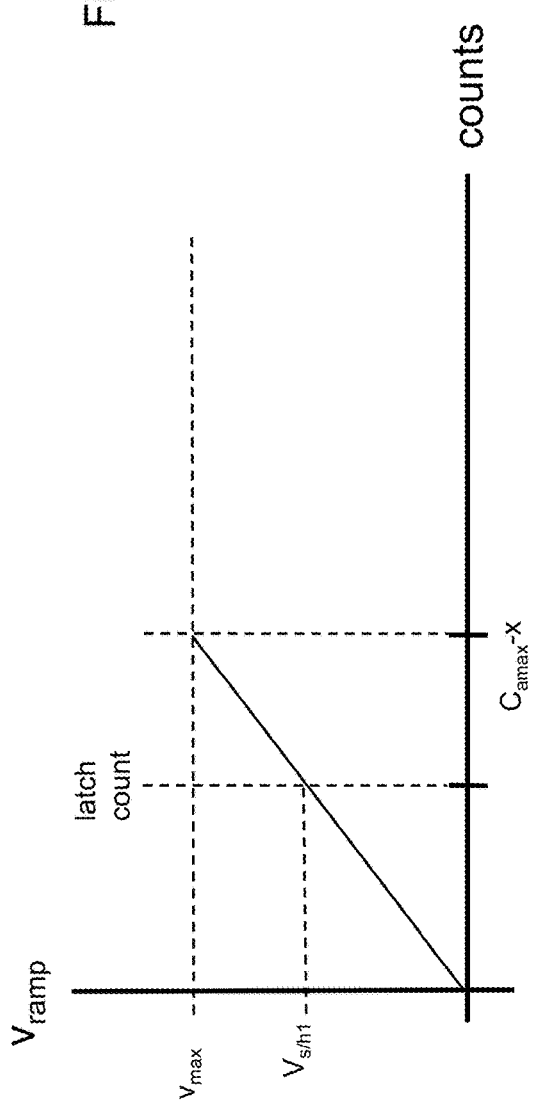
FIGS. 3a and 3b illustrate the operation of an A/D integrator, according to an illustrative embodiment.
Figure 3B:
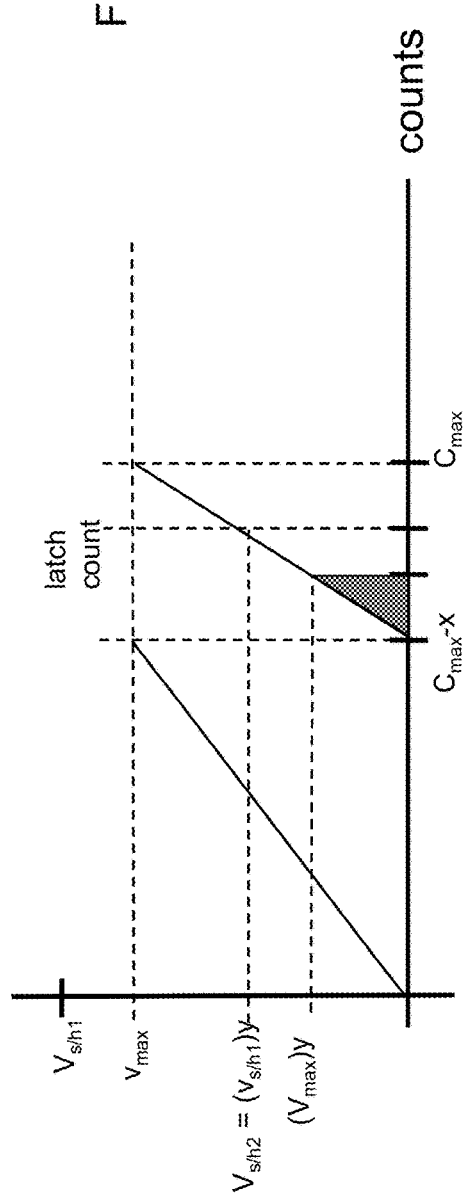

Although a variety of values for the various voltage levels, counts and times will produce acceptable results depending on the details of the FPA design and desired performance, some implementations are more desirable than others. A particularly beneficial implementation is illustrated in FIGS. 3a and b. For this case $v_{s1}=v_{s2}=v_{max}$, a voltage chosen to correspond to the maximum range (full count) desired for the digital conversion, $C_{max}$. $V_{max}$ can be determined in a variety of ways known in the art, but preferably depends on the voltage rails allowable in the circuit design and the noise floor. Typically 1 count (1 LSB) is chosen to represent the noise floor so as not to waste conversion resolution on noise, and the conversion size $C_{max}$ is chosen to correspond to an expected maximum level of the detector and any buffer electronics. For a particular tested implementation, the inventor chose $C_{max}$ to be 14 bits (16384) which limits $v_{max}$ to 1.6 V since the noise floor was ~100 microvolts. Since the swing possible on the detector signal is higher than 1.6 V, the A/D shown achieves the full useful noise floor limited resolution for lower amplitude signals but extends the dynamic range of the conversion at lower resolution for higher amplitude signals. In this system, x was chosen to be 1024, so the ramp slope for the second conversion cycle is ~16 times the first slope. y was chosen to be 4. The actual sample times and count rates depend on desired image frame rate, detector response times and allowable clock speeds for the readout.

An A/D converter may be implemented on the readout integrated circuit (IC) associated with or coupled to an FPA, which is typically an array of N pixels, each pixel consisting of an IR detector and associated interface electronics. The A/D components include components dedicated on a per pixel basis such as the comparators and latches, and components shared across many or all pixels such as the ramp generator and counter. The A/D converters presented herein are implemented efficiently in terms of power consumption, component count and complexity which is beneficial to the readout design and manufacture for a low cost IR camera. Moreover, the nature of the data and how it is encoded lends itself very well, as will be shown, to producing unexpected results in visual image quality for thermal imaging.

An FPA typically includes a two dimensional array of N detectors, which can provide a two-dimensional image of a scene. For imaging purposes, image frames, typically data from all or some of the detectors $N_f$, are produced by the FPA, each successive frame containing data from the array captured in successive time windows. Thus, a frame of data delivered by the FPA will consist of $N_f$ digital words, representing each pixel in the image, of length $C_{max}$. These words typically correspond to an intensity of radiation measured by each pixel in the array. The intensity per pixel, for a bolometer IR FPA, corresponds to temperature of the corresponding part of the scene, with lower values corresponding to colder regions and higher values to hotter regions. With the A/D disclosed, $N_f$ monotonic words encoded as described are produced per frame. It may be desirable to display this data on a visual display. The quality of the display and the ability to distinguish intensities visually lead to the desirable result of a user visually able to identify regions of differing temperature in a scene.

Figure 4:
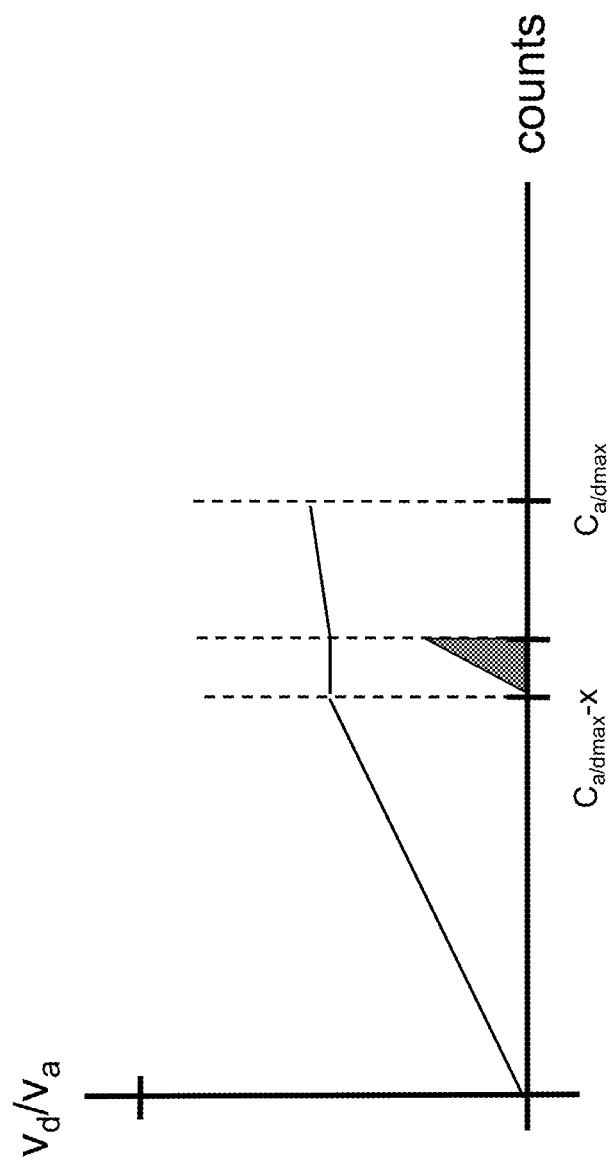
FIG. 4 illustrates a transfer function of an A/D converter, according to an illustrative embodiment.

FIG. 4 illustrates a transfer function of an A/D converter, according to an illustrative embodiment. Input signals below a certain value are converted in a first cycle and are thus subject to a higher gain (a first attenuation) and are converted with higher resolution, $v_{max}/(C_{max}-x)$. Input signals above a certain level are subject to a lower gain (a second attenuation) and are converted at lower resolution, $v_{max}/x$. There is a dead zone or discontinuity in the count as explained above. Thus, one monotonic digital word is generated for the entire extended dynamic range; however the word may not be a linear function of the input. In a preferred embodiment, the digital counter may be a Gray code (reflected binary) counter. This is advantageous because the analog detector signal may be an analog signal that is not synchronized with the digital counter. Thus, the comparator triggering is also un-synchronized, and may trigger in the middle of a count transition. If many bits are changing in a particular count transition, (such as 01111 to 10000) the data may be rippling at the latch point, which can result in conversion error. In Gray code counting, only one bit changes per transition, minimizing the possible transition error.

Figure 5:
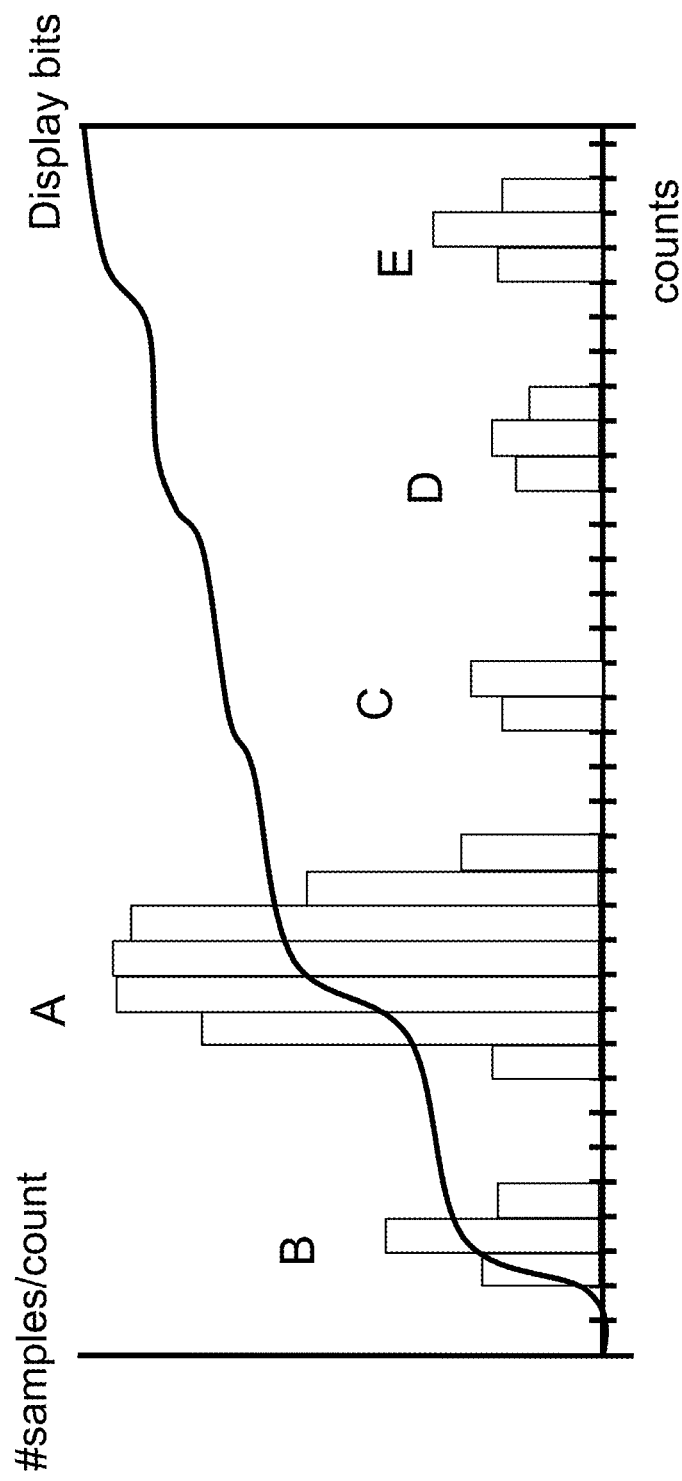
FIG. 5 illustrates a histogram based image display function, according to an illustrative embodiment.

If the purpose of the system is to visually display an infrared scene, the transfer function shown in FIG. 4 turns out to be unexpectedly advantageous. For an image display application, the FPA may be a square or rectangular array of N pixels, and the FPA may output successive frames of data from some or all of the pixels, $N_f$ pixels, in successive time windows, creating a video frame rate that is in turn displayed on a monitor or screen (single frames or averaged groups of frames may be used to display still images as well), such as a screen on a mobile computing device, such as a smartphone. Each frame consists of $N_f$ digital words (samples) of $C_{max}$ length, where the count value corresponds to the intensity for that pixel. For example, if the FPA is a 128×256 pixel array, for a full frame, $N_f$ would be 32768 samples per frame, each sample for a 14 bit conversion would be 14 bits in length. In an embodiment, the number of samples with a given count value (intensity) is plotted vs. counts (intensity), or range of counts, in a histogram. Intensity corresponds to temperature of various scene elements imaged by IR camera with higher count values representing higher temperature. An illustrative histogram is shown in FIG. 5 for a given frame of IR image data, such as would be expected if an image was acquired of a room with a person working on electronics with a soldering iron for instance. Such a scene will have a variety of temperatures. There will be a large number of pixels showing a relatively cool background for elements such as the walls, which is represented by the largest bins in the histogram at area A. There may be some cooler objects, such as objects recently brought into the room represented by the group of lower count values, at area B. There may be equipment which will be warmer than the background or a person also warmer than the walls, represented by the two groups of hotter pixels at areas C and D, and there will be a very hot group of pixels representing the soldering iron at area E. There will also be count values with no or very small numbers of pixels, such as the exclusion zone discussed above; and, in general, scenes imaged in the IR often have gaps as not all temperatures exist in many scenes.

The digital sample words may be converted into display compatible form to be shown on a screen. The display may have a digital brightness scale, which for an IR image corresponds to temperature, brighter being hotter. However, the brightness scale, for example grey scale, is generally a much shorter digital word than the pixel sample words. For instance the sample word may be 14 bits while a display range such as grey scale is typically 8 bits. So for display purposes, the higher resolution image data may be compressed down to fit the display range. How this is accomplished can affect visual image quality.

One way to allocate the samples to the display is to perform one of several image processing algorithms known as Histogram Equalization Based Methods, using the histogram of FIG. 5. These methods, including Contrast Limited Histogram Equalization (CLHE), Contrast Limited Adaptive Equalization (CLAHE) and many variations, may be used to allocate the display range 0 to B to the pixel intensities, 0 to $C_{max}$. These methods may have the effect of balancing the histogram, so that intensities with very few samples are not allocated significant fractions of the display range, while intensities with moderate number of samples are given enhanced fractions of display range, while very high count intensity bins are attenuated in display range, balancing the allocation of display range. Thus, the encoding of the current A/D may be directly compatible with HEBM. Also, HEBM by its nature adjusts for the exclusion zone and lower number of counts allocated to the higher intensity signals inherent in the current A/D.

Thus, in one embodiment, the highly efficient, low-part-count A/D, because of the nature of how it encodes the output data, combined with an HEBM conversion to display, results in very high visual image quality. The result for the class of uncooled IR cameras can be superior image quality at a low cost implementation with little penalty for the A/D data characteristics. For instance, a scene such as a soldering iron next to a person's face has excellent clarity for all features, which is excellent performance for thermal imaging.

One or more of the simplified equalization techniques disclosed herein may provide high contrast. They also may automatically account for the difference in gain between the two (or more) conversion ranges by allocating the majority of the brightness bits to the intensity count values corresponding to non-zero signals, thus ensuring that even though the numbers of pixels per count at the high end is smaller, the display bits are not wasted on zero or low data counts.

Figure 6:
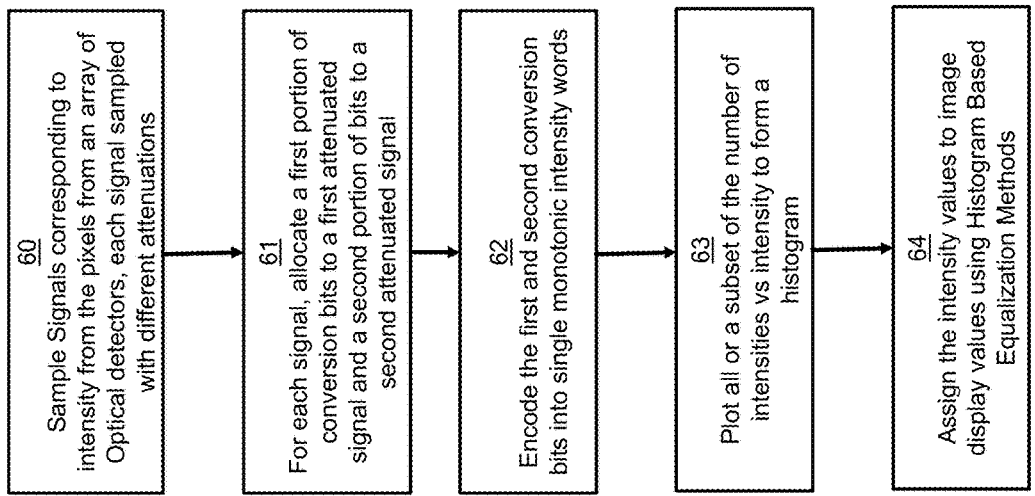
FIG. 6 illustrates a flowchart of a method of digitizing an infrared optical signal, according to an illustrative embodiment.

Referring now to FIG. 6, a flowchart illustrating a method of digitizing an infrared optical signal will be described, according to an illustrative embodiment. Step 60 is sample signals corresponding to intensity from the pixels from an array of optical detectors, each signal sampled with different attenuations. For example, the attenuation can be due to an integration time or sample/hold time such as $t_{s/h1}$. Step 61 is for each signal, allocate a first portion of conversion bits to a first attenuated signal and a second portion of bits to a second attenuated signal. The allocation can be preconfigured by the arrangement of circuit elements or per a programmed computing device; alternatively, they can be dynamically adjustable based on one or more inputs, such as display characteristics. The digitization may be done using a ramp and counter as described above, or using other analog-to-digital techniques. Step 62 is encode the first and second conversion bits into single monotonic intensity words. Step 63 is plot the number of intensities vs. intensity to form a histogram, and step 64 is assign the intensity values to image display values using Histogram Equalization Based Methods. Steps 62 through 64 may be accomplished by the arrangement of circuit elements or per a programmed computing device. One or more of the steps described in FIG. 6 may be rearranged, omitted or replaced with other processing steps. Lower amplitude signals may benefit from integration and averaging techniques to increase the apparent signal to noise. Such techniques may involve a combination of successive frames of digitized image data, often before equalization, to form a digital integration, which may then be averaged or otherwise processed before being equalized. For a two-signal-path A/D, combining successive pixels digitized on the different gain signal paths may be problematic.

For instance, one integration technique may include adding, on a per pixel basis, the pixels from M successive frames, where M is an integer, such as 4 or less for example, to form an integration frame where each pixel is the sum of the M corresponding pixels. It may be desirable to divide each integrated pixel by M, averaging, for instance to provide better signal to noise. If any of the successive pixels has been digitized on the low gain signal path, that successive pixel data cannot be summed and averaged with high gain data as is clear from the transfer function.

FIG. 7 illustrates a flow chart of an exemplary embodiment for combining digitized data from successive frames where such data may derive from differing gain digitization. In step 70, data is digitized from M successive frames. In step 71 any successive pixel from low gain conversion is detected. For each successive high gain pixel, the successive pixels are summed in step 72b. When a low gain pixel is detected, the sum if any is discarded, and the value of the first detected low gain pixel is multiplied by M in step 72a. In step 73 an M frame integration is produced where the pixels in the integrated frame are either the results of step 72a or 72b.

Thus, in this illustrative embodiment, the data from successive frames may be combined conditionally depending on whether or not there is any low gain signal path data in successive pixels. For successive pixels, where all of the data is high gain, corresponding to lower amplitude detector signals, the data may be combined directly and lower amplitude signals may benefit most from techniques that increase signal to noise. For successive pixels with any low gain data, corresponding to higher amplitude signals, signal to noise may not be as important, so one data point, the first low gain pixel detected, is used, not integrated but multiplied by M to match the encoding of the summed high gain pixels. Detection of the low gain signals may be accomplished in a variety of ways. For instance for a 14 bit conversion, where the high gain conversion is done in counts 0 to 15359, and the low gain conversion is done in counts 15360 to 16383, the top 4 most significant bits are all 1 (or the grey scale equivalent) for any low gain digitization.

While an infrared optical device is used in the illustrative embodiments described herein, the teachings may be applied to other types of optical devices, such as cameras sensing electromagnetic radiation in the visible light spectra and/or other spectra. References in the claims to "a" or "an" element or limitation are meant to be open-ended, allowing a plurality of such elements, meaning the same as "at least." References to a first and a second element are meant to broadly include systems or methods having three or more of such elements. The teachings herein are not limited to the specific embodiments disclosed, but may be applied to other alternative embodiments.

We claim:

1. A method for processing data from an imaging system, comprising;

sampling a signal from an optical detector with a first sample and hold, S/H, for a first sample time $t_{s/h1}$ and with a second S/H for a second sample time $t_{s/h2}$ where $t_{s/h1} > t_{s/h2}$, producing a digital counter signal at a counter and a ramp signal at a ramp, wherein the counter and the ramp are timed such that the counter counts from 0 to a predetermined number of counts, $C_{max}$-x, wherein $C_{max}$ is a number of counts corresponding to the number of bits desired for an analog to digital conversion of the detector signal and x is an integer corresponding to a subset of the number of bits, in approximately the time taken for the ramp to ramp from 0 to a predetermined voltage, $v_{s1}$, sending the first S/H output to a comparator and comparing it to the ramp signal, starting the counter and the ramp, after a time $>t_{s/h1}$, latching the count value if the ramp signal meets a threshold defined by the output of the first S/H before the counter counts to $C_{max}-x$, and if the latching does not happen before $C_{max}-x$ is reached:
  while the counter continues, sending the second S/H signal to the comparator,
  while the counter continues, resetting the ramp to zero and restarting the ramp at a slope sufficient to ramp from 0 to a predetermined voltage $v_{s2}$ in the time required for x counts, and
  latching the count value if the output of the ramp signal meets a threshold defined by the output of the second S/H, wherein the count latched is a digitization of the detector signal;
  wherein a subset of count values greater than $C_{max}-x$ comprise an excluded range of count values that do not correspond to possible values of the sampled signal, the excluded range corresponding to the time required for the restarted ramp to ramp from 0 to $v_{s1}$.

2. The method of claim 1, wherein $v_{s1}=v_{s2}=v_{max}$, wherein $v_{max}$ is the voltage selected to correspond to $C_{max}$, the maximum desired value of the digitization.

3. The method of claim 1, wherein $t_{s/h1}/t_{s/h2}$ is an integer $>1$.

4. The method of claim 3, wherein $t_{s/h1}/t_{s/h2}$ is 4.

5. The method of claim 1, wherein $x=1024$.

6. The method of claim 5, wherein $C_{max}=16383$.

7. The method of claim 2, wherein $v_{max}=1.6$ volts.

8. The method of claim 1, wherein the imaging system is a 2-dimensional focal plane array with N pixels, and each pixel comprises an optical detector.

9. The method of claim 8, wherein a frame of data is a digital word from each of $N_f$ pixels, and wherein $N_f$ is number between 1 and N, the method further comprising producing the digital words of all pixels in a frame.

10. The method of claim 9, further comprising developing a histogram for a frame of data wherein at least one of the number of pixels with a given digitized value is plotted versus count value.

11. The method of claim 10, further comprising displaying the frame of data with a display brightness level range of 0 to $B_d$ where $B_d$ is an integer less than $C_{max}$.

12. The method of claim 11, further comprising assigning display range levels to pixel words using a Histogram Based Equalization Method, wherein the displaying is based at least in part on the display range levels.

13. The method of claim 1, wherein the counter is a gray code (reflected binary) counter.

14. A digitization system for digitizing data from an infrared imaging system, the system comprising:
  a sampling circuit configured to sample a signal from an infrared optical detector with a first sample time and a second sample time; and
  a processing circuit configured to digitize the sampled signal at a predetermined number of bits desired for an analog to digital conversion of the sampled signal with a first portion of bits allocated to digitizing the sampled signal having a first sample time and a second portion of bits allocated to digitizing the sampled signal having the second sample time, and to encode the first and second portion of bits into one digital word corresponding to a range of the sampled signal, wherein the encoding is a monotonic function having at least one discontinuity, the discontinuity comprising an excluded range of digital word values that do not correspond to possible values of the sampled signal.

15. The digitization system of claim 14, wherein the processing circuit further comprises a ramp signal generator configured to generate a ramp signal and a counter circuit configured to generate a counter value.

16. The digitization system of claim 14, wherein the imaging system is a 2-dimensional focal plane array with N pixels, each pixel comprising an optical detector, wherein a frame of data is a digital word from each of $N_f$ pixels, wherein $N_f$ is number between 1 and N.

17. The digitization system of claim 16, wherein the processing circuit is further configured to:
  generate histogram data for a frame of data wherein the number of pixels with a given digitized value is plotted versus value;
  generate display data for the frame of data with a display brightness level range of 0 to $B_d$; and
  assign display range levels to pixel words using histogram equalization based methods.

18. A method for digitizing data from an imaging system, comprising;
  sampling a signal from an optical detector with a first circuit having a first attenuation and with a second circuit having a second attenuation different than the first attenuation;
  digitizing the sampled signal at a predetermined number of bits desired for an analog to digital conversion of the sampled signal by allocating a first portion of bits to digitizing a signal from the first circuit and allocating a second portion of bits to digitizing a signal from the second circuit; and
  encoding the first and second portion of bits into one digital word corresponding to a range of the sampled signal, wherein the encoding is a monotonic function having at least one discontinuity, the discontinuity comprising an excluded range of digital word values that do not correspond to possible values of the sampled signal.

19. The method of claim 18, wherein the imaging system is a 2-dimensional focal plane array with N pixels, and each pixel comprises an optical detector, wherein a frame of data is a digital word from each of $N_f$ pixels, wherein $N_f$ is number between 1 and N and a digitization according to claim 18 produces the digital words of pixels in a frame.

20. The method of claim 19, further comprising:
  developing a histogram for a frame of data wherein at least one of the number of pixels with a given digitized value is plotted versus value;
  displaying the frame data with a display brightness level range of 0 to $B_d$; and
  assigning display range levels to pixel words using a Histogram Based Equalization Method.

21. The method of claim 19 wherein the first and second attenuations correspond to a high and a low gain and successive frames of data are combined conditionally on a per pixel basis, whereby the combination of successive pixels all digitized at high gain are combined in a first manner, and any successive group of pixels with at least one low gain pixel conversion are combined in a second manner.

22. The method of claim 21 wherein the frame combining is a digital integration, comprising;
   acquiring digitized data from M successive frames,
   detecting any pixel in a frame that is a result of a low gain conversion as the frames are digitized,
   summing pixels from M successive frames,
   in response to the detecting, discarding any sum and multiplying the value of the first detected low gain pixel by M, and;
   forming an M frame integration where each integrated pixel is either the result of the summing step or the multiplying step.

* * * * *